(12) United States Patent
Yen et al.

(10) Patent No.: US 10,444,304 B2
(45) Date of Patent: Oct. 15, 2019

(54) PARTICLE EVENT RECORDATION

(71) Applicant: General Electric Company, Schenectady, NY (US)

(72) Inventors: Yichin Yen, Hinckley, OH (US); Michael Barry DeLong, Macedonia, OH (US)

(73) Assignee: General Electric Company, Schenectady, NY (US)

( * ) Notice: Subject to any disclaimer, the term of this patent is extended or adjusted under 35 U.S.C. 154(b) by 1289 days.

(21) Appl. No.: 14/225,477

(22) Filed: Mar. 26, 2014

(65) Prior Publication Data
US 2019/0204121 A1  Jul. 4, 2019

(51) Int. Cl.
*G01N 27/74* (2006.01)
*G01R 33/12* (2006.01)

(52) U.S. Cl.
CPC .................................. *G01R 33/12* (2013.01)

(58) Field of Classification Search
CPC .... G01R 33/1269; G01R 33/12; G01N 27/74; G01N 27/745
USPC ......................................................... 324/204
See application file for complete search history.

(56) References Cited

U.S. PATENT DOCUMENTS

| | | | | |
|---|---|---|---|---|
| 3,369,222 A | * | 2/1968 | Webb | G06F 17/18 377/129 |
| 3,426,197 A | * | 2/1969 | Schwartzman | G01T 1/06 250/390.03 |
| 4,661,913 A | * | 4/1987 | Wu | G01N 15/1456 356/442 |
| 6,215,903 B1 | * | 4/2001 | Cook | G06T 9/005 382/232 |
| 7,609,054 B2 | * | 10/2009 | Tondra | G01V 3/08 324/204 |
| 8,731,860 B2 | * | 5/2014 | Charles | G01N 15/1012 702/104 |

(Continued)

FOREIGN PATENT DOCUMENTS

| | | |
|---|---|---|
| EP | 0677754 A1 | 10/1995 |
| WO | 2007092127 A2 | 8/2007 |
| WO | 2009121130 A1 | 10/2009 |

OTHER PUBLICATIONS

Faisal, M., et al. "A data processing system for real-time pulse processing and timing enhancement for nuclear particle detection systems." IEEE Transactions on Nuclear Science 60.2 (2013): 619-623.*

(Continued)

*Primary Examiner* — Christopher P McAndrew
(74) *Attorney, Agent, or Firm* — Mintz Levin Cohn Ferris Glovsky and Popeo, P.C.

(57) ABSTRACT

Presented herein are systems, methods, and nonvolatile computer-readable storage devices for informing a particle event processor of a particle detector of events arising within a sensor period. The systems, methods, and nonvolatile computer-readable storage devices involve the generation of a sensor data set detected by a particle event sensor and representing the events arising within the particle detector during the sensor period. The systems, methods, and nonvolatile computer-readable storage devices also involve the compression of the sensor data set with a waveform compression technique to generate a compressed sensor data set, and the transmission of the compressed sensor data set to the particle event processor.

17 Claims, 7 Drawing Sheets

(56) References Cited

U.S. PATENT DOCUMENTS

| | | | |
|---|---|---|---|
| 2001/0052769 A1* | 12/2001 | Simmonds | B82Y 15/00 324/204 |
| 2001/0052770 A1* | 12/2001 | Simmonds | B82Y 15/00 324/204 |
| 2005/0117700 A1 | 6/2005 | Peschmann | |
| 2009/0296871 A1* | 12/2009 | Taleyarkhan | G01T 1/167 376/153 |
| 2010/0109653 A1* | 5/2010 | Nieuwenhuis | B82Y 25/00 324/204 |
| 2011/0196637 A1* | 8/2011 | Sharpe | G01N 15/1012 702/104 |
| 2012/0161754 A1* | 6/2012 | Irmscher | B03C 1/0335 324/204 |

OTHER PUBLICATIONS

Patauner, Christian. Lossy and lossless data compression of data from high energy physics experiments, na CERN-THESIS-2011-211//2011.*

Bousselham, Abdelkader, Peter Ojala, and Christian Bohm. "Digital timing with non-stationary noise optimal filter algorithm for LSO/APD detectors." Nuclear Science Symposium Conference Record, 2007. NSS'07. IEEE. vol. 1. IEEE, 2007.*

Faisal, Muhammad, et al. "A correlation-based pulse detection technique for gamma-ray/neutron detectors." Nuclear Instruments and Methods in Physics Research Section A: Accelerators, Spectrometers, Detectors and Associated Equipment 652.1 (2011): 479-482.*

Gardner et al., "Real-Time Compression of Logging Data", Proceedings of the European Petroleum Conference, France, pp. 557-566, Nov. 16, 1992.

Hassan et al., "Zero Latency Image Compression for Real Time Logging While Drilling Applications", Proceeding of MTS/IEEE Washington, pp. 1-6, Sep. 18, 2005.

Caen, "Digital Pulse Processing in Nuclear Physics Rev. 3", Electronic Instrumentation, pp. 1-18, Aug. 26, 2011.

European Search Report and Opinion issued in connection with corresponding EP Application No. 15160584.7 dated Aug. 25, 2015.

* cited by examiner

PARTICLE EVENT RECORDATION

BACKGROUND OF THE INVENTION

Field of the Invention

The present disclosure is related to the tracking of events within the field of particle detection.

Discussion of the Prior Art

A particle detector may be configured to detect events such as the presence of particles such as protons, neutrons, electrons, and quarks, and the emission of various types of energy, such as gamma rays. Many such particle detectors include a particle event sensor that generates a sensor data set representing the events, and transmits the sensor data set to a particle event processor that performs various types of evaluation, such as distinguishing between particle event types. However, if the evaluation is to be performed in near-realtime, it may be difficult to transmit the entire uncompressed sensor data set to the particle event processor, e.g., due to bandwidth limitations in the communication channel between the particle event sensor and the particle event processor. Therefore, many such particle detectors reduce the sensor data set before transmission by applying a filter that trims the sensor data set to a selected set of portions, such as the portions of the sensor data set that are likely to represent events involving a selected subset of particle types, such as only events involving the detection of neutrons. The filtered sensor data set is often of sufficiently low bandwidth to enable near-realtime transmission to and near-realtime processing by the particle event processor.

BRIEF DESCRIPTION OF THE INVENTION

The following presents a simplified summary of the invention in order to provide a basic understanding of some example embodiments of the invention. This summary is not an extensive overview of the invention. Moreover, this summary is not intended to identify critical elements of the invention nor delineate the scope of the invention. The sole purpose of the summary is to present some concepts of the invention in simplified form as a prelude to the more detailed description that is presented later.

In accordance with one embodiment, the present invention provides a system for informing a particle event processor of events arising within a particle detector during a sensor period. In one such embodiment, this system includes a particle event sensor that generates a sensor data set representing the events arising within the particle detector during the sensor period; and a data set transmitter that compresses the sensor data set with a waveform compression technique to generate a compressed sensor data set, and transmits the compressed sensor data set to the particle event processor.

In accordance with another embodiment, the present invention provides a method of informing a particle event processor of events arising within a particle detector during a sensor period. In one such embodiment, the method includes generating a sensor data set detected by a particle event sensor and representing the events arising within the particle detector during the sensor period; compressing the sensor data set with a waveform compression technique to generate a compressed sensor data set; and transmitting the compressed sensor data set to the particle event processor.

In accordance with yet another embodiment, the present invention provides a nonvolatile computer-readable storage device storing instructions that enable a particle detector to inform a particle event processor of events arising within the particle detector. In one such embodiment, the nonvolatile computer-readable storage device comprises instructions that, when executed on a processor of the particle detector, cause the particle detector to generate a sensor data set detected by a particle event sensor of the particle detector and representing the events arising within the particle detector during the sensor period; compress the sensor data set with a waveform compression technique to generate a compressed sensor data set; and transmit the compressed sensor data set to the particle event processor.

To the accomplishment of the foregoing and related ends, the following description and annexed drawings set forth illustrations of certain aspects and embodiments. These are indicative of but a few of the various ways of embodying one or more aspects of the presented techniques. Other aspects, advantages, and embodiments of the present invention will become apparent from the following detailed description when considered in conjunction with the annexed drawings.

BRIEF DESCRIPTION OF THE DRAWINGS

The foregoing discussion of the present invention will become apparent to those skilled in the art to which the present invention relates upon reading the following description with reference to the accompanying drawings, in which.

DETAILED DESCRIPTION OF THE INVENTION

A. Introduction

Within the field of physics, many types of particle detectors are constructed and maintained to initiate, detect, monitor, and record the occurrence of one or more events relevant to the study of particle physics. The detection of such events by various sensors during a sensor period may result in a sensor data set, which may be evaluated by a variety of evaluation techniques to determine the occurrence, frequency, location, magnitude, timing, and/or causal relationships of one or more events arising within a carefully prepared environment, such as a radioactive material that produces a variety of particles and/or energy transmissions during radioactive decay. The study of such events may provide a wealth of information about the materials, properties, environmental conditions, and exhibited laws of nature of the scenario under study.

Figure 1:
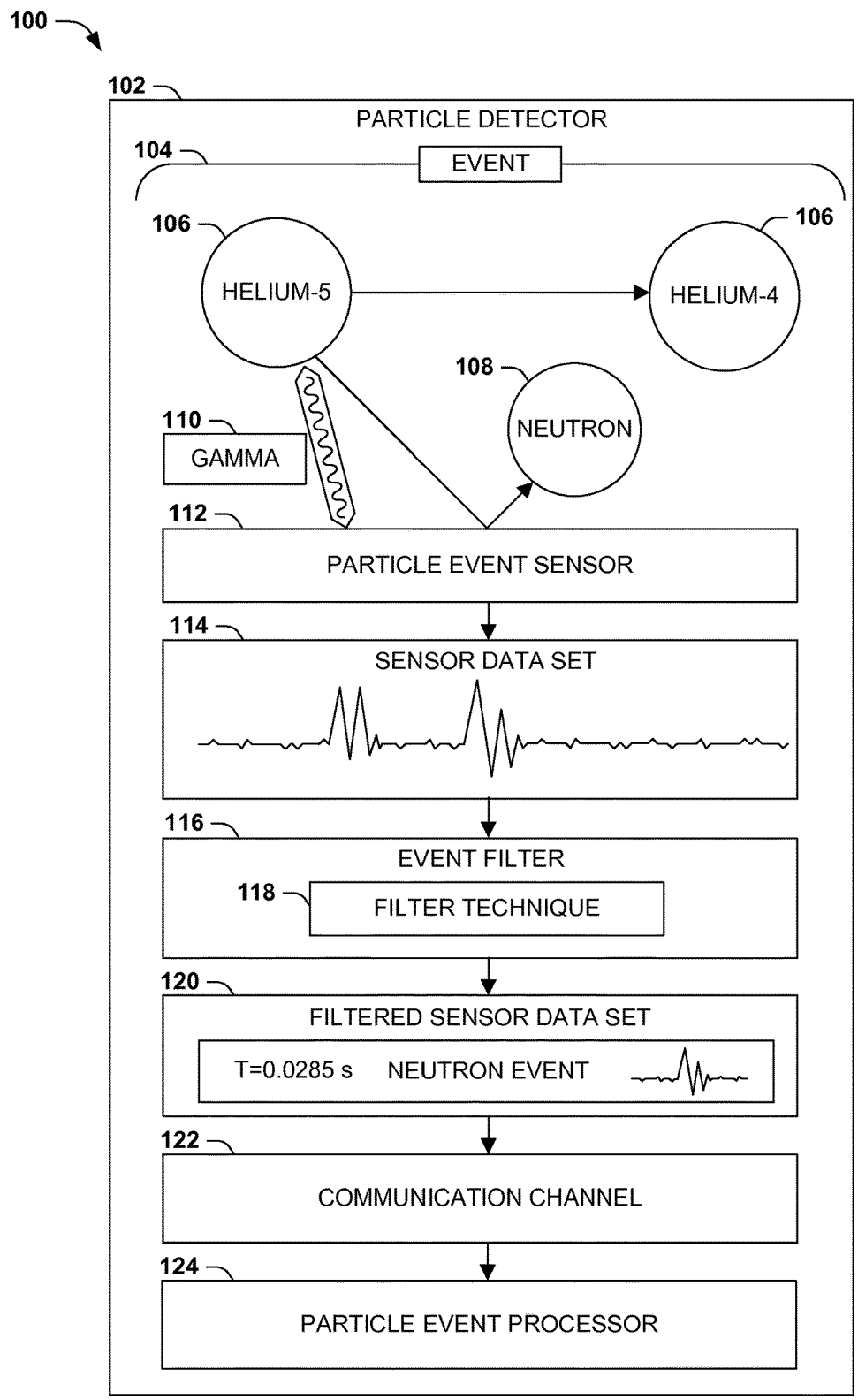
FIG. 1 is a schematic illustration of an example particle detector that applies an event filters to a sensor data set before transmission to a particle event processor.

FIG. 1 is an illustration of an example scenario 100 featuring a particle detector 102 comprising a set of devices that are configured to interoperate in order to achieve the evaluation of an event 104. The particle detector 102 includes a particle event sensor 112 that records various types of data about various particles 106 within the particle detector 102, such as a helium isotope, and events 104 pertaining thereto, such as the decaying of the isotope that produces a neutron 108 and a gamma ray 110. The particle event sensor 112 generates a sensor data set 114 representing detected events 104 arising within the particle detector 102 during a sensor period, such as a collision between the particle event sensor and the neutron 108 and the incidence of a gamma ray 110 upon the particle event detector 112 that have been generated during the decay of the helium isotope. The sensor data set 114 is to be transmitted over a communication channel 122, such as a local communication bus or a wired or wireless network adapter, to a particle event processor 124 for evaluation.

In many such example scenarios 100, the evaluation is often performed by the particle event processor 124 in a near-realtime manner in order to yield evaluation results that are usable to control the particle detector 102, e.g., to monitor the progress of the reaction, and/or as a feedback mechanism that adaptively adjusts the monitoring parameters of the particle event sensor 112. However, difficulties may arise due to the volume of the sensor data set 114; e.g., some particle detectors 102 may involve a large number of particle event sensors 112 concurrently contributing to the sensor data set 114, and/or high-resolution data that entails a large volume of generated data. It may be difficult for the particle event processor 124 to evaluate such voluminous data in near-realtime, and in some circumstances, it may even be difficult to transmit the voluminous sensor data set 114 to the particle event processor 124 over the communication channel 122 (e.g., the rate of data generation may exceed the bandwidth of the communication channel 122, thus inducing a transmission lag that may grow linearly). Such logistics may interfere with the near-realtime processing of the sensor data set 114 by the particle event processor 124.

Some techniques may be utilized to transmit the sensor data set 114 to the particle event processor 124 in view of these limitations.

As a first example, the capacity of the communication channel 122 and/or the computational capacity of the particle event sensor 124, such as by adding supplemental hardware. However, such supplemental hardware may increase the cost and/or complexity and/or may reduce the efficiency and/or reliability of the particle detector 102, and some evaluation techniques may not be amenable to such parallelization.

As a second example, and as illustrated in the example scenario 100 of FIG. 1, an event filter 116 may be applied to the sensor data set 114, wherein a filter technique 118 enables the identification and selection of portions of the sensor data set 114 that are of greater interest, and/or the removal of portions of the sensor data set 114 that are not of interest. For example, a researcher may only be interested in evaluating events 104 involving the detection of neutrons 108, and may not wish to evaluate events 104 involving other types of particles 106, or the emission of energy such as gamma rays 110.

In view of such limitations, a particle detector 102 may include an event filter 116 that applies one or more filter techniques 118 to the sensor data set 114, and thus produces a filtered sensor data set 120 that represents only the events 104 of interest, entailing a significantly lower volume of data. As one such example, a circuit that performs a high-pass filter may be positioned in the data path prior to transmission to the communication channel 122. The filtered sensor data set 120 may then be suitably transmitted to the particle event processor 124 over the communication channel 122 for near-realtime processing, thereby increasing the efficiency of the particle event evaluation.

While the use of filtering in the example scenario 100 of FIG. 1 may enable the near-realtime processing of the sensor data set 114, some disadvantages may arise from the application of such filtering.

As a first example, such architectures may be amenable only to comparatively simple and causal filter techniques 118, which may exhibit an undesirable degree of false positives and/or false negatives. More complex filter techniques 118 may be difficult to implement inline for the data path without interfering with the near-realtime processing by the particle event processor 124.

As a second example, the filtering may remove information that may be of interest; e.g., the detection of the neutron 108 by the particle event sensor 112 may be causally related to the emission of the gamma ray 110, and filtering out the portion of the sensor data set 114 reflecting the incidence of the gamma ray 110 produced by the particle 106 may impair the evaluation of the event 104.

As a third example, a filter technique 118 may be inadequate in some circumstances to reduce the volume of data to maintain lag-free transmission over the communication channel 122 and/or near-realtime processing by the particle event processor 124; e.g., a filter technique 118 that retains only the portions of the sensor data set 114 events 104 involving neutrons 108 may not be able to reduce the volume of data comprising the sensor data set 114 in the event of a large number of detected neutrons 108. These and other circumstances reflect the potential inadequacy of the event filter 116 to satisfy the near-realtime evaluation of the event 104 by the particle event processor 124.

B. Presented Techniques

Figure 2:
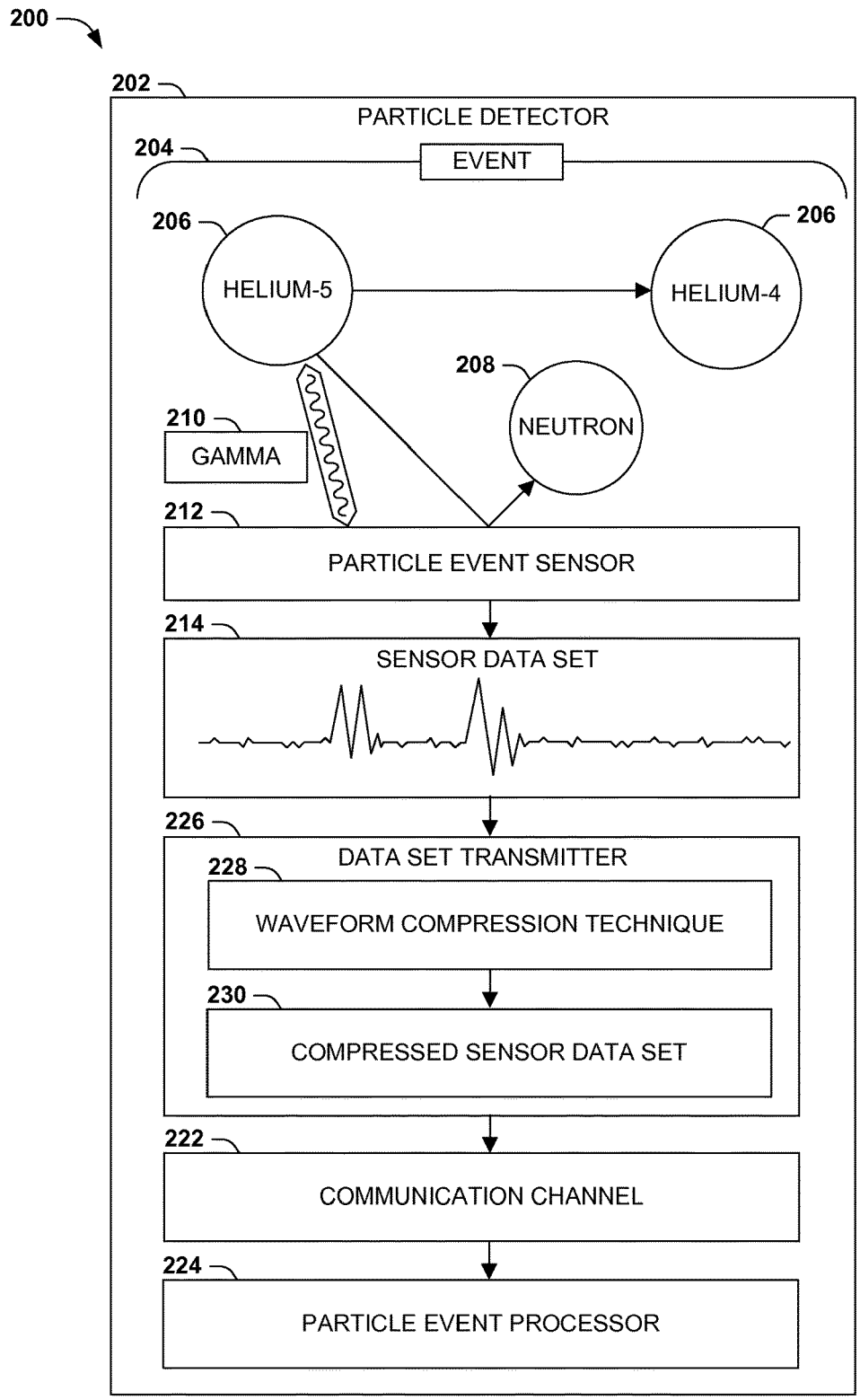
FIG. 2 is a schematic illustration of an example particle detector that applies a waveform compression technique to compress a sensor data set before transmission to a particle event processor, in accordance with at least one embodiment of the present invention.

FIG. 2 presents an illustration of an example scenario 200 of a particle detector 202 informing a particle event processor 224 of events 204 arising within the particle detector 202 in accordance with the techniques presented herein. In this example scenario 200, a particle event sensor 212 detects the events 204 and generates a sensor data set 214 representing the events 204 arising within the particle detector 202 during a sensor period. A data set transmitter 226 compresses the sensor data set 214 with a waveform compression technique 228 to generate a compressed sensor data set 230, and transmits the compressed sensor data set 230 to the particle event processor 224 (e.g., using a communication channel 222 such as a local communication bus or a wired or wireless network adapter).

The compression of the sensor data set 214 with a waveform compression technique 228 in this example scenario 200 may provide various advantages with respect to other scenarios, including the example scenario 100 of FIG. 1.

As a first such example, many types of waveform compression techniques are available that may be selected for application to the sensor data set, where such waveform compression techniques may already exist as well-understood and/or highly optimized implementations. For example, many variants of the discrete cosine transform (DCT) may be available for use by the data set transmitter as the waveform compression technique.

As a second such example, the type of data generated by the particle event sensor is amenable to acceptable compression with various waveform compression techniques, which may result in a compressed sensor data set with a significant compression ratio that enables transmission over a communication channel that is not capable of transmitting the uncompressed sensor data set in near-realtime may be capable of transmitting the compressed sensor data set in near-realtime.

As a third such example, many waveform compression techniques achieve lossless or near-lossless representation of a sensor data set, wherein a subsequent decompression of the compressed sensor data set produces a literally or nearly complete reconstruction of the sensor data set that was originally generated by the particle event sensor.

As a fourth such example, many waveform compression techniques are applicable in a comparatively efficient manner, and are thus suitable for application inline within the data path of the sensor data set. Such efficiency therefore enables a continuous compression, and optionally decompression, of the sensor data set in a manner that is suitable for sustained near-realtime processing by unspecialized software and hardware.

As a fifth such example, many waveform compression techniques are applicable in a streaming and/or continuous basis, and may therefore be applied to a streaming sensor data set incrementally, in contrast with other compression techniques that are more suitable for application to the entire sensor data set provided as a unit. These and other advantages may result from the use of a waveform compression technique to generate the compressed sensor data set for transmission to the particle event processor in accordance with the techniques presented herein.

C. Example Embodiments

The example scenario 200 of FIG. 2 provides one embodiment of the techniques presented herein, illustrated as an example system for informing a particle event processor 224 of events 204 arising within a particle detector 202 during a sensor period. The example system includes a particle event sensor 212 that generates a sensor data set 214 representing the events 204 arising within the particle detector 202 during the sensor period. The example system also includes a data set transmitter 226 that compresses the sensor data set 214 with a waveform compression technique 228 to generate a compressed sensor data set 230, and transmits the compressed sensor data set 230 to the particle event processor 224.

Figure 3:
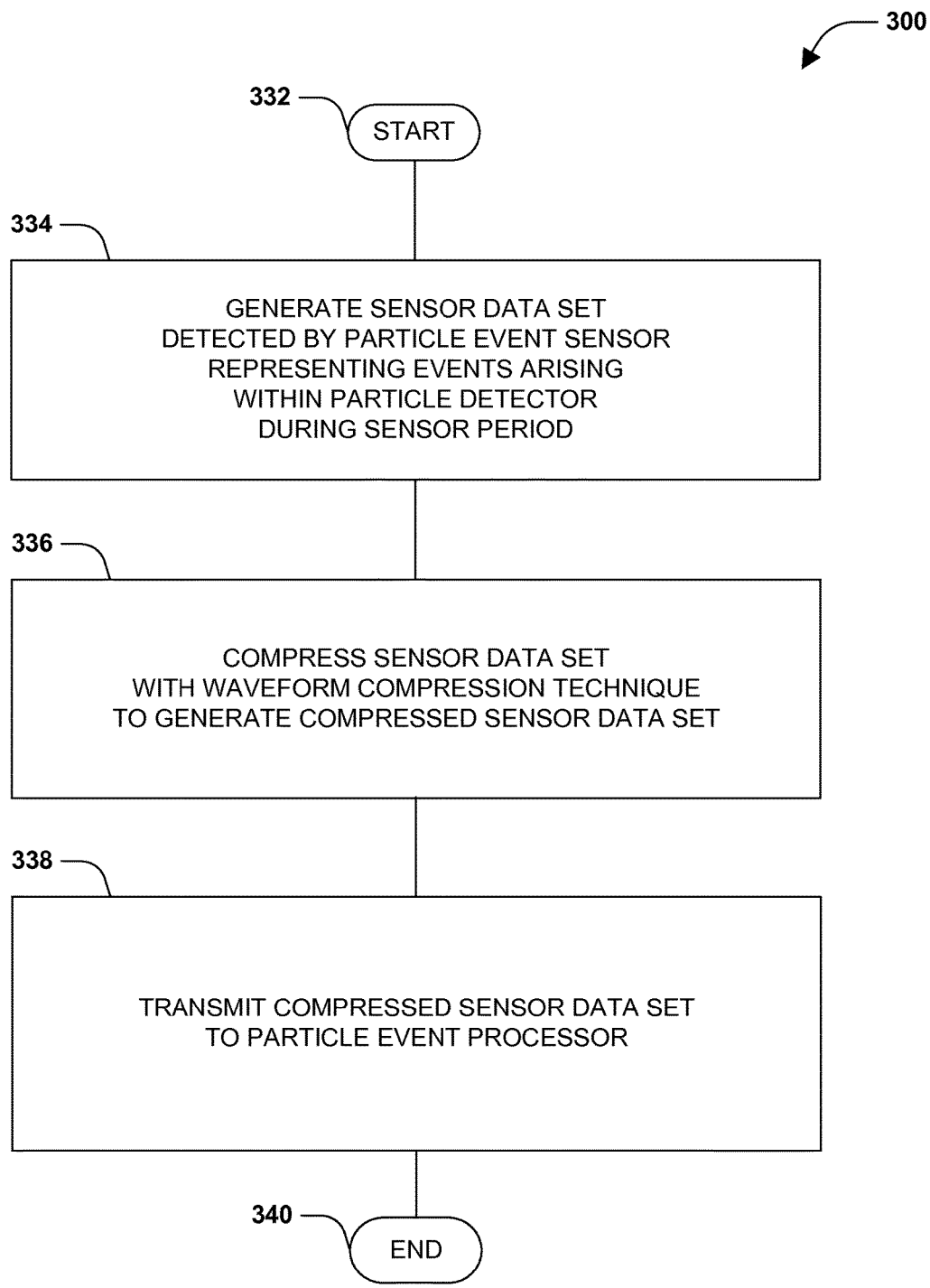
FIG. 3 is a top-level flowchart of an example method of informing a particle event processor of events arising within a particle detector during a sensor period, in accordance with at least one embodiment of the present invention.

FIG. 3 is an illustration of a flow diagram illustrating one embodiment of the techniques presented herein, illustrated as an example method 300 of informing a particle event processor of events arising within a particle detector during a sensor period. The example method 300 may be implemented, e.g., as instructions executing on a processor of a particle detector 202; as a circuit operating within the particle detector 202; or as a combination thereof. The example method 300 begins at 332 and includes generating 334 a sensor data set detected by a particle event sensor and representing the events arising within the particle detector during the sensor period. The example method 300 also includes compressing 336 the sensor data set with a waveform compression technique to generate a compressed sensor data set. The example method 300 also includes transmitting 338 the compressed sensor data set to the particle event processor. Having achieved informing the particle event processor of the events arising within the particle detector, the example method 300 thus ends at 340.

Embodiments of the techniques presented herein may include a computer-readable storage medium usable to cause a particle detector to utilize the techniques presented herein. Such computer-readable storage media may include, e.g., computer-readable storage media involving a tangible device, such as a memory semiconductor (e.g., a semiconductor utilizing static random access memory (SRAM), dynamic random access memory (DRAM), and/or synchronous dynamic random access memory (SDRAM) technologies), a platter of a hard disk drive, a flash memory device, or a magnetic or optical disc (such as a CD-R, DVD-R, or floppy disc), encoding a set of computer-readable instructions that, when executed by a processor of a device, cause the device to implement the techniques presented herein. Such computer-readable media may also include (as a class of technologies that are distinct from computer-readable storage media) various types of communications media, such as a signal that may be propagated through various physical phenomena (e.g., an electromagnetic signal, a sound wave signal, or an optical signal) and in various wired scenarios (e.g., via an Ethernet or fiber optic cable) and/or wireless scenarios (e.g., a wireless local area network (WLAN) such as WiFi, a personal area network (PAN) such as Bluetooth, or a cellular or radio network), and which encodes a set of computer-readable instructions that, when executed by a processor of a device, cause the device to implement the techniques presented herein.

Figure 4:
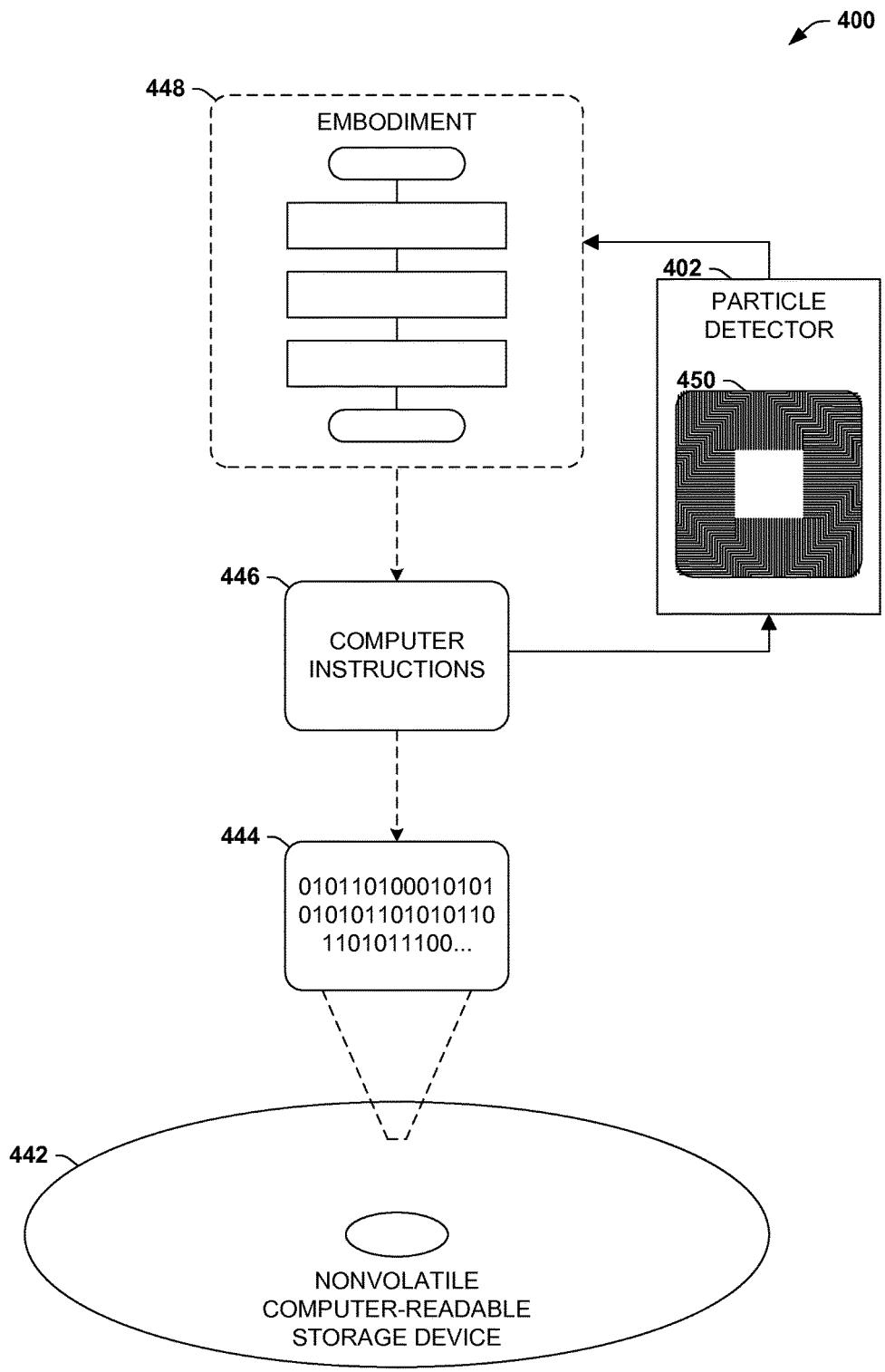
FIG. 4 is schematic illustration of an example computer-readable storage medium usable to configure a particle detector to inform a particle event processor of events arising within a particle detector during a sensor period, in accordance with at least one embodiment of the present invention.

FIG. 4 is an illustration of an embodiment of a computer-readable storage medium, including an example nonvolatile computer-readable storage device 442 (e.g., a CD-R, DVD-R, or a platter of a hard disk drive), on which is encoded computer-readable data 444. This computer-readable data 444 in turn includes a set of computer instructions 446 configured to operate as an embodiment 448 of the techniques presented herein. In one such embodiment, the processor-executable instructions 446 may be configured to, when executed on a processor 450 of a particle detector 402, cause the particle detector 402 to implement an system for informing a particle event processor of events arising within the particle detector 402, such as the example system illustrated in the example scenario 200 of FIG. 2. In one such embodiment, the processor-executable instructions 446 utilize a method of informing a particle event processor of events arising within the particle detector 402, such as the example method 300 illustrated in FIG. 3. Many such computer-readable media may be devised by those of ordinary skill in the art that are configured to operate in accordance with the techniques presented herein.

D. Variations

The techniques discussed herein may be devised with variations in many aspects, and some variations may present additional advantages and/or reduce disadvantages with respect to other variations of these and other techniques. Moreover, some variations may be implemented in combination, and some combinations may feature additional advantages and/or reduced disadvantages through synergistic cooperation. The variations may be incorporated in various embodiments (e.g., the example system of FIG. 3, the example method of FIG. 4, and/or the example computer-readable storage medium of FIG. 5) to confer individual and/or synergistic advantages upon such embodiments.

D1. Scenarios

A first aspect that may vary among embodiments of these techniques relates to the scenarios wherein such techniques may be utilized.

As a first variation of this first aspect, the techniques may be utilized within many types of particle detectors, such as cyclotron facilities; synchrotron radiation facilities; electron/positron accelerator and/or collider facilities; electron/proton accelerator and/or collider facilities; and hadron accelerator and/or collider facilities. The particle detector may be a set of devices and/or instruments interoperating together within a building; the entire building containing the devices and/or instruments; and/or a collection of over two or more buildings, which may be grouped together and/or geographically distant. The techniques may also may be performed among facility devices of at least two buildings that together comprise the particle detector facility (e.g., buildings connected by a communication bus).

As a second variation of this first aspect, the techniques may be utilized with particle detectors that include various types of particle detector components, such as a beam monitor component; a neutron instrument component; a neutron chopper component; a nuclear reactor component; and a particle accelerator component. Such particle detector components may also include various types of computing devices, such as a user workstation device; a server facility device; and a portable user computing device, such as a notebook computer, a tablet, and a phone. Such components of the particle detector may also include particle detector infrastructure devices, such as network components (e.g., network adapters, routers, switches, hubs, and modems), and/or infrastructure and industrial control components, such as facility supervisory control and data acquisition (SCADA) components that enable the control of power, climate control, water, communication, automation, monitoring, and industrial processes.

As a third variation of this first aspect, the components of the particle detector may interoperate using various types of wired and/or wireless communication channels, such as a physical cable and/or a wireless communication frequency. Such communication channels may also utilize various networking techniques, such as Ethernet, Infiniband, Fiber Channel, WiFi, Bluetooth, and cellular communication, and/or various types of network protocols, such as a variant of the transmission control protocol (TCP), the user datagram protocol (UDP), and/or the internet protocol (IP). These and other variations in particle detectors may be compatible with the techniques presented herein.

D2. Processing of Sensor Data Set

A second aspect that may vary among embodiments of the techniques presented herein involves the processing and use of the sensor data set.

As a first variation of this second aspect, a particle event processor may promptly utilize the sensor data set upon receipt, e.g., by promptly decompressing the sensor data set and evaluating the sensor data set in near-realtime. Alternatively or additionally, a particle event sensor may store part or all of the sensor data set in a data store for later evaluation. Additionally, the particle event sensor may first decompress the sensor data set prior to storage in the data store, and/or may store the compressed sensor data set for decompression and evaluation at a later time.

As a second variation of this second aspect, various types of evaluation may be applied to the sensor data set. For example, the sensor data set may be evaluated using at least one event evaluation technique selected from an event evaluation technique set comprising a wavelet transform technique; a zero crossing time transform technique; a pulse width ratio technique; a rise time analysis technique; a charge time integration technique; a decay time technique; a pattern recognition technique; a reference pulse comparison technique; and an artificial neural network technique. As one such example, a particle event processor may determine an event type for respective events, where the event type is selected from an event type set comprising a neutron pulse event type, and a gamma pulse event type.

Figure 5:
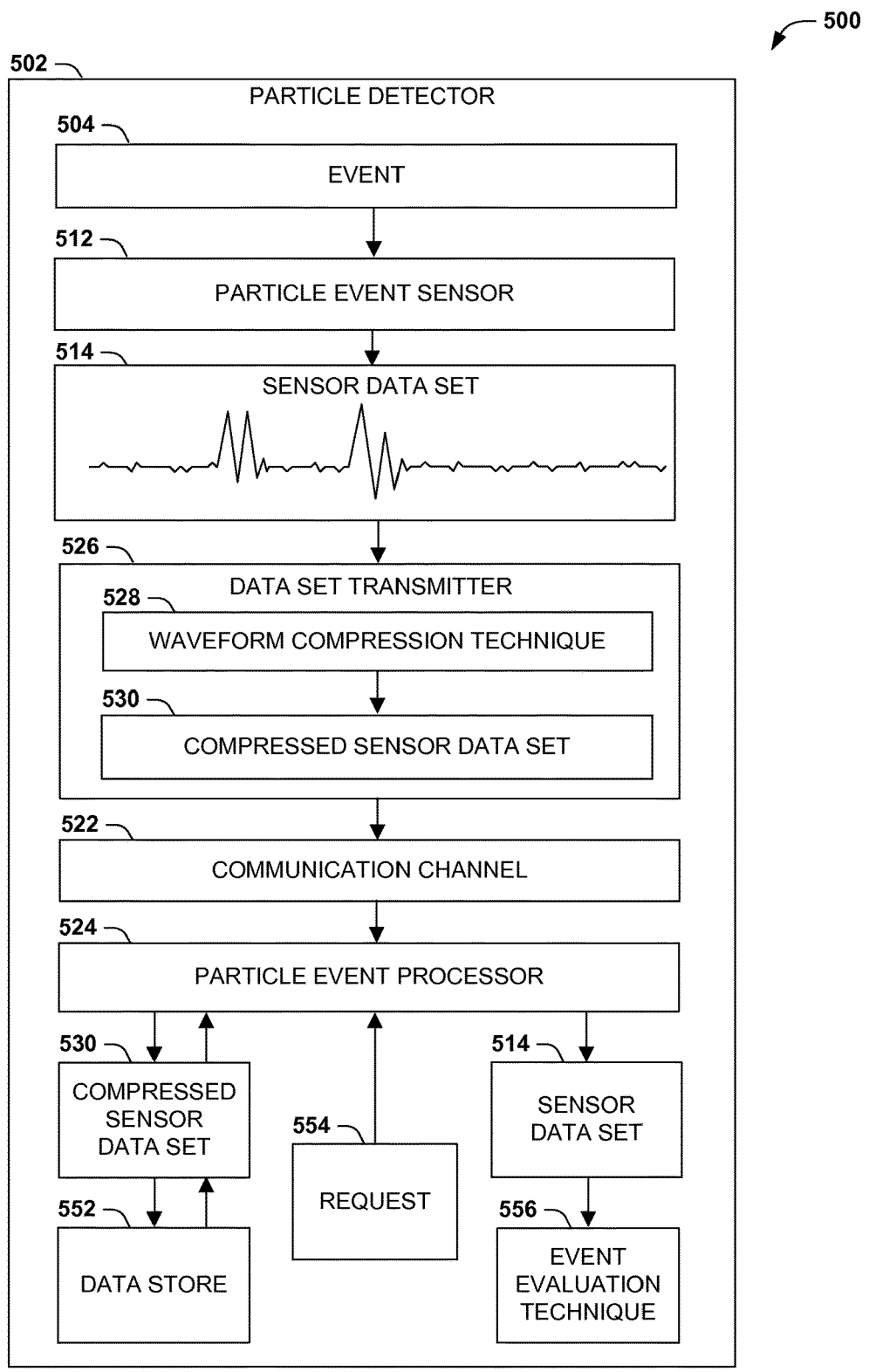
FIG. 5 is a schematic illustration of an example particle detector that stores a compressed sensor data set, and applies various evaluation techniques in fulfillment of a request to evaluate the sensor data set, in accordance with at least one embodiment of the present invention.

FIG. 5 presents an illustration of an example scenario 500 featuring a particle detector 502 that stores and utilizes a sensor data set 514 in accordance with several such variations of this second aspect. In this example scenario 500, in a similar manner as previously presented in the example scenario 200 of FIG. 2, a particle detector 502 includes a particle event sensor 512 that generates a sensor data set 514 representing one or more events 504 arising within the particle detector 502; and a data set transmitter 526 that applies a waveform compression technique 528 to the sensor data set 514 to generate a compressed sensor data set 530, and transmits the compressed sensor data set 530 to the particle event processor 524. In this example scenario 500, the particle detector 502 also includes a data store 552 that, upon receiving the compressed sensor data set 530, stores the compressed sensor data set 530. Additionally, the particle event processor 524, upon receiving a request 554 to identify the events 504 arising within the particle detector 502 during the sensor period, retrieves the compressed sensor data set 530 from the data store 552; using the waveform compression technique 528, decompresses the compressed sensor data set 530 to retrieve the sensor data set 514 that was generated by the particle event sensor 512; and applies one or more event evaluation techniques 556 to the sensor data set 514 in order to identify the events 504 arising within the particle detector 502 during the sensor period.

As a third variation of this second aspect, various types of filtering may be applied to a sensor data set following decompression. For example, a particle event processor may generate, from the sensor data set, a filtered sensor data set that includes, for respective events of a first event type (e.g., a neutron pulse event type), a first sensor data set portion for the event of the first event type, while excluding, for respective events of a second event type (e.g., a gamma pulse event type), a second sensor data set portion for the event of the second event type.

As a further example of this third variation of this second aspect, a particle event processor may filter the sensor data set with a data set filter that is selected from a data set filter set comprising at least two data set filters. In an embodiment, the particle event processor adaptively filters the data set by the filtering by associating respective data set filters are associated with at least one particle detector condition of the particle detector (e.g., a particle energy level condition, or a radiation influx rate condition). The particle detector may, while detecting the events with the particle event sensor, detect a current particle detector condition, and select, from the data set filter set, a selected data set filter that is associated with the current particle detector condition.

Figure 6:
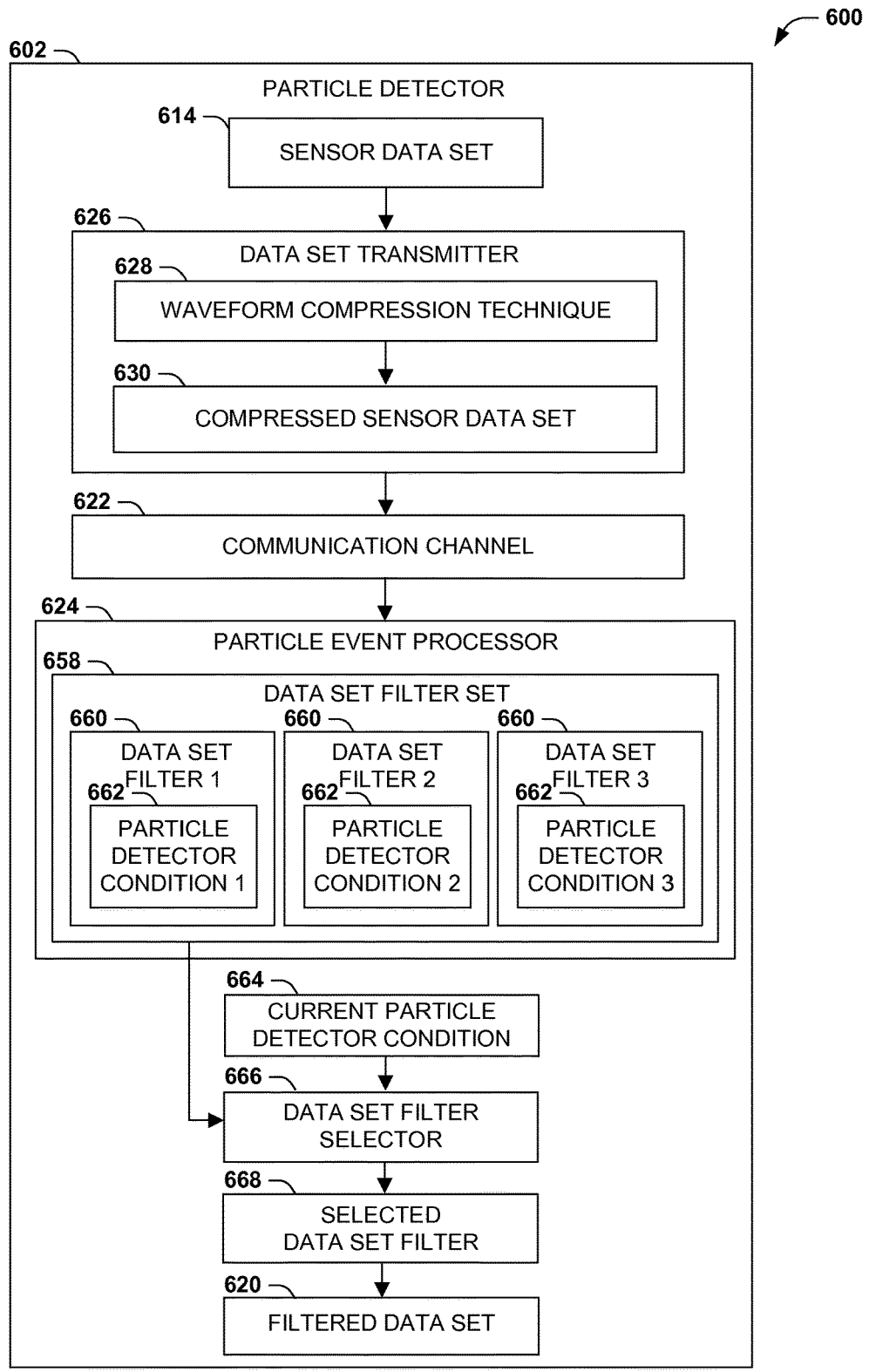
FIG. 6 is a schematic illustration of an example particle detector that stores a compressed sensor data set, and applies a selected data set filter to a particle event sensor based on an adaptive selection of the filter in view of a current particle detector condition of the particle detector, in accordance with at least one embodiment of the present invention.

FIG. 6 is an illustration of an example scenario 600 featuring an adaptive filtering of a sensor data set 614 in accordance with the techniques presented herein. In this example scenario 600, in a similar manner as previously presented in the example scenario 200 of FIG. 2, a sensor data set 614 is generated representing one or more events arising within the particle detector 602. A data set transmitter 626 applies a waveform compression technique 628 to the sensor data set 614 to generate a compressed sensor data set 630, and transmits the compressed sensor data set 630 to the particle event processor 624. In this example scenario 600, the particle event processor 624 also includes a data set filter set 658, which includes at least two data set filters 660 that are respectively associated with a particle detector condition 662. A data set filter selector 666 may detect a current particle detector condition 664 of the particle detector 602, and may compare the current particle detector condition 664 with the particle detector conditions 662 associated with various data set filters 660 in order to select a selected data set filter 668. The selected data set filter 668 is then applied to the sensor data set 614 in order to generate a filtered sensor data set 620. In this manner, the sensor data set 614 is both compressed before transmission over the communication channel 622, enabling near-realtime processing of the sensor data set 614 by the particle event sensor 624, and also adaptively filtered in accordance with the current particle detector conditions 664 of the particle detector 602.

E. Computing Environment

Figure 7:
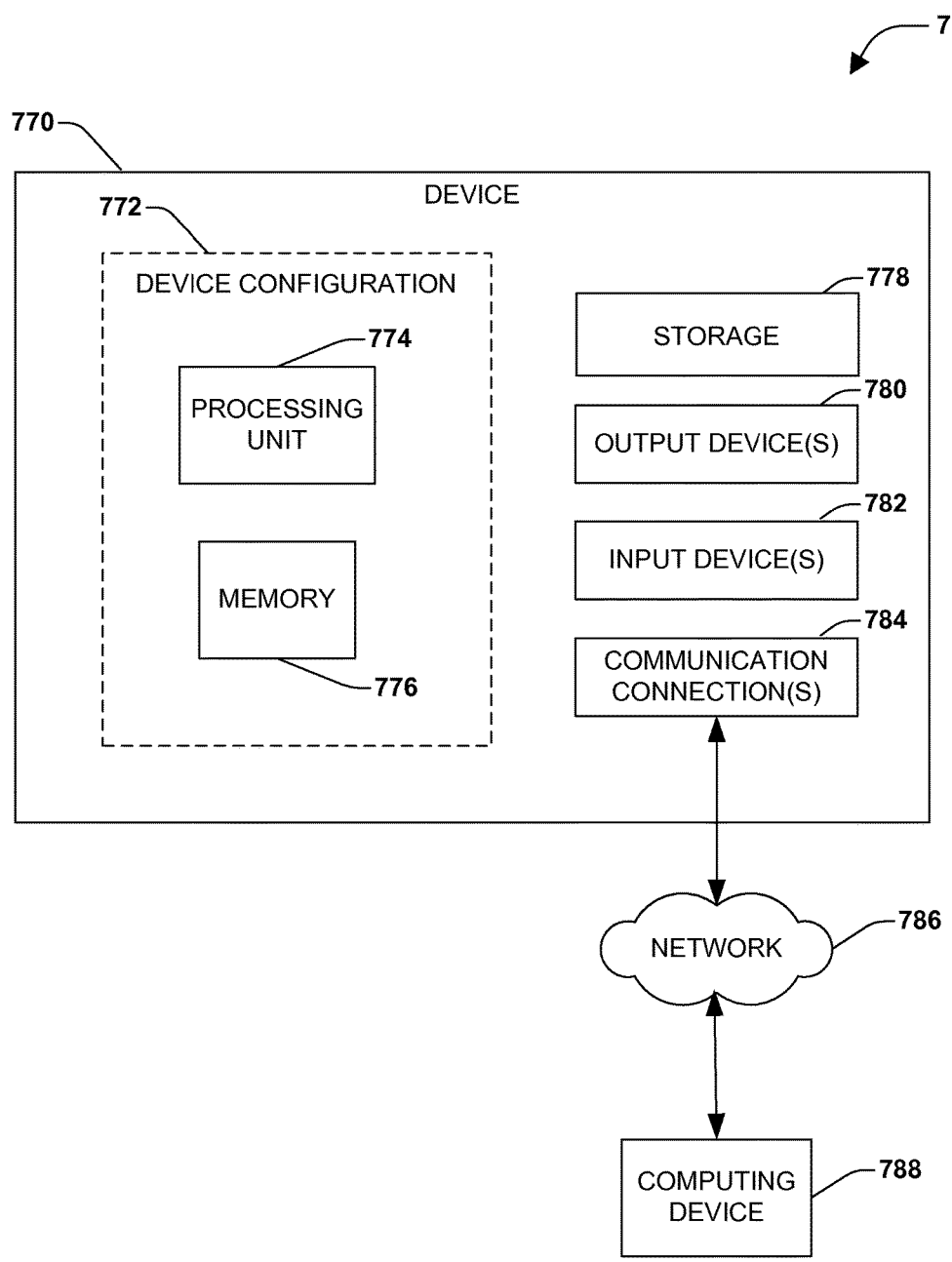
FIG. 7 is a schematic illustration of an example set of particle detector facility devices configured to synchronize a set of clock components over a data network for absolute event time recording in accordance with at least one embodiment of the present invention.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 7 illustrates an example of a system 700 including a computing device 770 configured to implement one or more embodiments provided herein. In one configuration, computing device 770 includes a device configuration 774 featuring at least one processing unit 774 and memory 776. Depending on the exact configuration and type of computing device, memory 776 may be volatile (such as RAM, for example), non-volatile (such as ROM, flash memory, etc., for example) or some combination of the two. This configuration is illustrated in FIG. 7 by dashed line.

In other embodiments, device 770 may include additional features and/or functionality. For example, device 770 may also include additional storage (e.g., removable and/or non-removable) including, but not limited to, magnetic storage, optical storage, and the like. Such additional storage is illustrated in FIG. 7 by storage 778. In one embodiment, computer readable instructions to implement one or more embodiments provided herein may be in storage 778. Storage 778 may also store other computer readable instructions to implement an operating system, an application program, and the like. Computer readable instructions may be loaded in memory 776 for execution by processing unit 774, for example.

The term "computer readable media" as used herein includes computer-readable storage devices. Such computer-readable storage devices may be volatile and/or non-volatile, removable and/or non-removable, and may involve various types of physical devices storing computer readable instructions or other data. Memory 776 and storage 778 are examples of computer storage media. Computer-storage storage devices include, but are not limited to, RAM, ROM, EEPROM, flash memory or other memory technology, CD-ROM, Digital Versatile Disks (DVDs) or other optical storage, magnetic cassettes, magnetic tape, and magnetic disk storage or other magnetic storage devices.

Device 770 may also include communication connection(s) 784 that allows device 770 to communicate with other devices. Communication connection(s) 784 may include, but is not limited to, a modem, a Network Interface Card (NIC), an integrated network interface, a radio frequency transmitter/receiver, an infrared port, a USB connection, or other interfaces for connecting computing device 770 to other computing devices. Communication connection(s) 784 may include a wired connection or a wireless connection. Communication connection(s) 784 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 770 may include input device(s) 782 such as keyboard, mouse, pen, voice input device, touch input device, infrared cameras, video input devices, and/or any other input device. Output device(s) 780 such as one or more displays, speakers, printers, and/or any other output device may also be included in device 770. Input device(s) 782 and output device(s) 780 may be connected to device 770 via a wired connection, wireless connection, or any combination thereof. In one embodiment, an input device or an output device from another computing device may be used as input device(s) 782 or output device(s) 780 for computing device 770.

Components of computing device 770 may be connected by various interconnects, such as a bus. Such interconnects may include a Peripheral Component Interconnect (PCI), such as PCI Express, a Universal Serial Bus (USB), Firewire (IEEE 1394), an optical bus structure, and the like. In another embodiment, components of computing device 770 may be interconnected by a network. For example, memory 776 may include multiple physical memory units located in different physical locations interconnected by a network.

Those skilled in the art will realize that storage devices utilized to store computer readable instructions may be distributed across a network. For example, a computing device 788 accessible via network 786 may store computer readable instructions to implement one or more embodiments provided herein. Computing device 770 may access computing device 788 and download a part or all of the computer readable instructions for execution. Alternatively, computing device 770 may download pieces of the computer readable instructions, as needed, or some instructions may be executed at computing device 770 and some at computing device 788.

F. Use of Terms

Embodiments or examples, illustrated in the drawings, are disclosed below using specific language. These examples are provided to disclose the invention, including the best mode, and also to enable any person skilled in the art to practice the invention, including making and using any devices or systems and performing any incorporated methods. The embodiments or examples are not intended to be limiting. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Any alterations and modifications in the disclosed embodiments, and any further applications of the principles disclosed in this document are contemplated as would normally occur to one of ordinary skill in the pertinent art.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A system, comprising:
    a particle event sensor, sensitive to both neutron and gamma events, that generates a singular sensor data set representing both the neutron and gamma events arising within the particle detector during a sensor period; and
    a data set transmitter that:
        compresses the sensor data set with a waveform compression technique to generate a compressed sensor data set; and
        transmits the compressed sensor data set to a particle event processor.

2. The system of claim 1, wherein the waveform compression technique comprises a discrete cosine transform.

3. The system of claim 1, wherein the particle event processor comprises:
    a data store that, upon receiving the compressed sensor data set during the sensor period, stores the compressed sensor data set; and
    a particle event processor that, upon receiving a request to identify the events arising within the particle detector during the sensor period:
        retrieves the compressed sensor data set from the data store;
        using the waveform compression technique, decompresses the compressed sensor data set to retrieve the sensor data set generated by the particle event sensor; and
        evaluates the sensor data set to identify the events arising within the particle detector during the sensor period.

4. The system of claim 3, wherein the particle event processor further determines, for respective events, an event type, where the event type is selected from an event type set comprising:
- a neutron pulse event type; and
- a gamma pulse event type.

5. The system of claim 4, wherein the particle event processor further generates, from the sensor data set, a particle event data set that:
- comprises, for respective events of the neutron pulse event type, a first sensor data set portion for the event; and
- excludes, for respective events of the gamma pulse event type, a second event sensor data set for the event.

6. The system of claim 3, wherein the particle event processor evaluates the sensor data set using at least one event evaluation technique selected from an event evaluation technique set comprising:
- a wavelet transform technique;
- a zero crossing time transform technique;
- a pulse width ratio technique;
- a rise time analysis technique;
- a charge time integration technique;
- a decay time technique;
- a pattern recognition technique;
- a reference pulse comparison technique; and
- an artificial neural network technique.

7. The system of claim 3, wherein the particle event processor, after decompressing the compressed sensor data set with the waveform compression technique, filters the sensor data set with a selected data set filter that is selected from a data set filter set comprising at least two data set filters.

8. The system of claim 7, wherein:
- respective data set filters are associated with at least one particle detector condition; and
- the system further comprises an event filter selector that:
  - evaluates the sensor data set to detect a current particle detector condition; and
  - selects, from the data set filter set, a selected data set filter that is associated with the current particle detector condition.

9. The system of claim 8, wherein the particle detector conditions respectively associated with at least one data set filter are selected from a particle detector condition set comprising:
- a particle energy level condition; and
- a radiation influx rate condition.

10. A method, comprising:
- detecting both neutron and gamma events with a particle event sensor during a sensor period;
- generating a singular sensor data set detected by particle event sensor and representing the events arising within the particle detector during the sensor period, the data set representing both the neutron and gamma events;
- compressing the sensor data set with a waveform compression technique to generate a compressed sensor data set; and
- transmitting the compressed sensor data set to a particle event processor.

11. The method of claim 10, further comprising:
- determining, for respective events, an event type of the event, where the event type is selected from an event type set comprising:
  - a neutron pulse event type, and
  - a gamma pulse event type; and
- generating, from the sensor data set, a particle event data set that:
  - comprises, for respective events of the neutron pulse event type, a first sensor data set portion for the event; and
  - excludes, for respective events of the gamma pulse event type, a second event sensor data set for the event.

12. The method of claim 10, further comprising:
- upon receiving the compressed sensor data set during the sensor period, storing the compressed sensor data set in a data store; and
- upon receiving a request to identify the events arising within the particle detector during the sensor period:
  - retrieving the compressed sensor data set from the data store;
  - using the waveform compression technique, decompressing the compressed sensor data set to retrieve the sensor data set generated by the particle event sensor; and
  - evaluating the sensor data set to identify the events arising within the particle detector during the sensor period.

13. The method of claim 12, further comprising:
- evaluating the sensor data set to detect a current particle detector condition;
- selecting, from a data set filter set comprising at least two data set filters that are respectively associated with at least one particle detector condition, a selected data set filter that is associated with the current particle detector condition; and
- after decompressing the compressed sensor data set with the waveform compression technique, filtering the sensor data set with the selected data set filter.

14. A non-transitory computer-readable storage device storing instructions that, when executed by at least one data processor of at least one computing system, cause a particle detector to implement operations comprising:
- generating a singular sensor data set, representative of both neutron and gamma events detected by a particle event sensor of the particle detector and representing the events arising within the particle detector during a sensor period;
- compressing the sensor data set with a waveform compression technique to generate a compressed sensor data set; and
- transmitting the compressed sensor data set to a particle event processor.

15. The non-transitory computer-readable storage device of claim 14, wherein the instructions further cause the particle detector to:
- determine, for respective events, an event type of the event, where the event type is selected from an event type set comprising:
  - a neutron pulse event type, and
  - a gamma pulse event type; and
- generate, from the sensor data set, a particle event data set that:
  - comprises, for respective events of the neutron pulse event type, a first sensor data set portion for the event; and
  - excludes, for respective events of the gamma pulse event type, a second event sensor data set for the event.

16. The non-transitory computer-readable storage device of claim 14, wherein the instructions further cause the particle detector to:

upon receiving the compressed sensor data set during the sensor period, store the compressed sensor data set in a data store; and upon receiving a request to identify the events arising within the particle detector during the sensor period:
retrieve the compressed sensor data set from the data store;
using the waveform compression technique, decompress the compressed sensor data set to retrieve the sensor data set generated by the particle event sensor; and
evaluate the sensor data set to identify the events arising within the particle detector during the sensor period.

17. The non-transitory computer-readable storage device of claim 16, wherein the instructions further cause the particle detector to:
evaluate the sensor data set to detect a current particle detector condition;
select, from a data set filter set comprising at least two data set filters that are respectively associated with at least one particle detector condition, a selected data set filter that is associated with the current particle detector condition; and
after decompressing the compressed sensor data set with the waveform compression technique, filter the sensor data set with the selected data set filter.

\* \* \* \* \*